United States Patent
Jhan et al.

(10) Patent No.: US 11,908,685 B2
(45) Date of Patent: Feb. 20, 2024

(54) METHODS OF REDUCING GATE SPACER LOSS DURING SEMICONDUCTOR MANUFACTURING

(71) Applicant: Taiwan Semiconductor Manufacturing Co., Ltd., Hsin-Chu (TW)

(72) Inventors: Yi-Ruei Jhan, Keelung (TW); Han-Yu Lin, Nantou County (TW); Li-Te Lin, Hsinchu (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 255 days.

(21) Appl. No.: 17/201,744

(22) Filed: Mar. 15, 2021

(65) Prior Publication Data

US 2021/0202247 A1    Jul. 1, 2021

Related U.S. Application Data

(62) Division of application No. 16/259,345, filed on Jan. 28, 2019, now Pat. No. 10,950,434.

(60) Provisional application No. 62/690,799, filed on Jun. 27, 2018.

(51) Int. Cl.
  *H01L 21/02* (2006.01)
  *H01L 29/66* (2006.01)
  *H01L 29/40* (2006.01)
  *H01L 21/3105* (2006.01)
  *H01L 21/265* (2006.01)

(52) U.S. Cl.
  CPC .. *H01L 21/02321* (2013.01); *H01L 21/26586* (2013.01); *H01L 21/31053* (2013.01); *H01L 29/401* (2013.01); *H01L 29/66545* (2013.01)

(58) Field of Classification Search
  CPC ......... H01L 29/66545; H01L 29/66795; H01L 29/785; H01L 29/0847; H01L 29/66537
  See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |

(Continued)

*Primary Examiner* — Tony Tran
(74) *Attorney, Agent, or Firm* — HAYNES AND BOONE, LLP

(57) ABSTRACT

A method includes forming a gate spacer on sidewalls of a dummy gate structure disposed over a semiconductor substrate; performing a first implantation process to the gate spacer, wherein the first implantation process includes bombarding an upper portion of the gate spacer with silicon atoms; after performing the first implantation process, performing a second implantation process to the upper portion of the gate spacer, where the second implantation process includes bombarding the upper portion of the gate spacer with carbon atoms; and after performing the second implantation process, replacing the dummy gate structure with a high-k metal gate structure, wherein the replacing includes forming an interlayer dielectric (ILD) layer.

20 Claims, 8 Drawing Sheets

(56) References Cited

U.S. PATENT DOCUMENTS

| | | |
|---|---|---|
| 9,236,300 B2 | 1/2016 | Liaw |
| 9,520,482 B1 | 12/2016 | Chang et al. |
| 9,576,814 B2 | 2/2017 | Wu et al. |
| 2011/0227157 A1* | 9/2011 | Yang ........................ H01L 29/78 257/347 |
| 2016/0359020 A1* | 12/2016 | Choi ................ H01L 29/66795 |

* cited by examiner

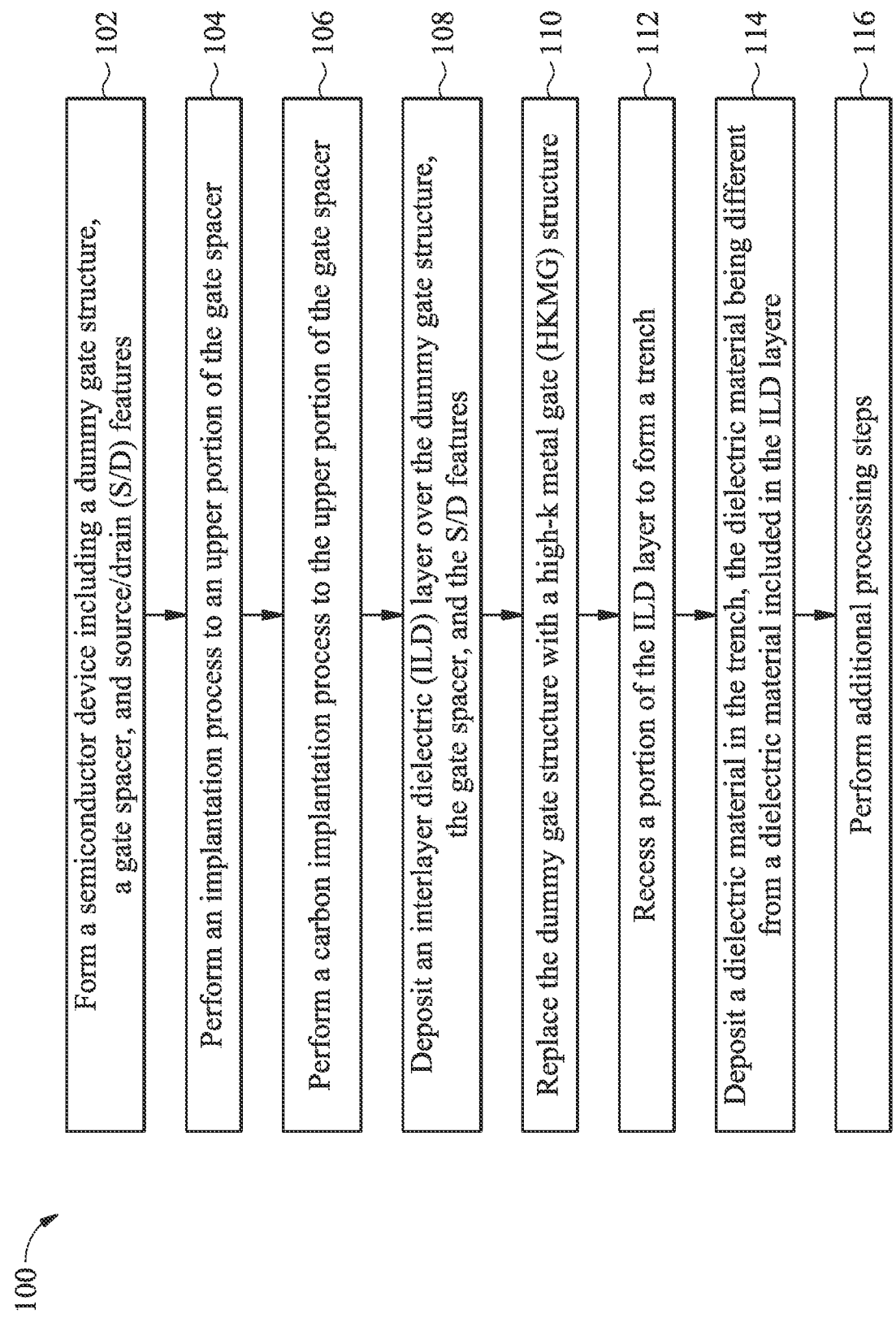

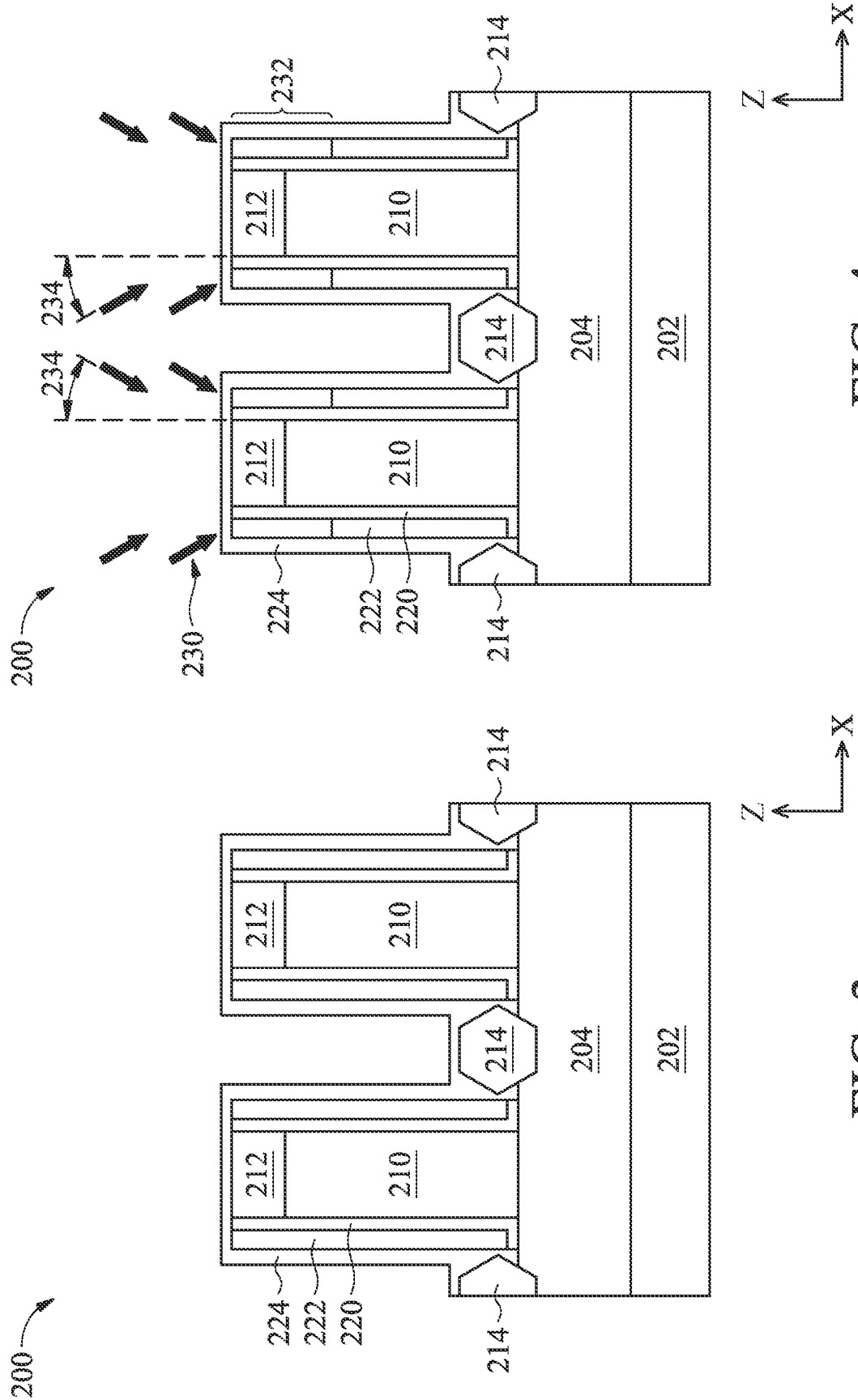

METHODS OF REDUCING GATE SPACER LOSS DURING SEMICONDUCTOR MANUFACTURING

CROSS-REFERENCE

This is a Divisional of U.S. patent application Ser. No. 16/259,345 filed on Jan. 28, 2019, which claims priority to U.S. Provisional Patent Application Ser. No. 62/690,799 filed on Jun. 27, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as feature sizes decrease, processing of an interlayer dielectric layer formed over a source/drain feature in an IC device may inadvertently damage structure and performance of other portions of the same IC device, such as, for example, nearby gate spacers designed to protect metal gate structures. While methods of mitigating such damage have generally been adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows a flowchart of a method of fabricating a semiconductor device according to various aspects of the present disclosure.

FIGS. 3, 4, 5, 6, 7, 8, 9, 10, 11A, 11B, and 12 are cross-sectional views of an embodiment of the semiconductor device of FIGS. 2A and 2B taken along dashed line AA' during intermediate steps of an embodiment of the method of FIG. 1 according to various aspects of the present disclosure.

DETAILED DESCRIPTION

Figure 2B:
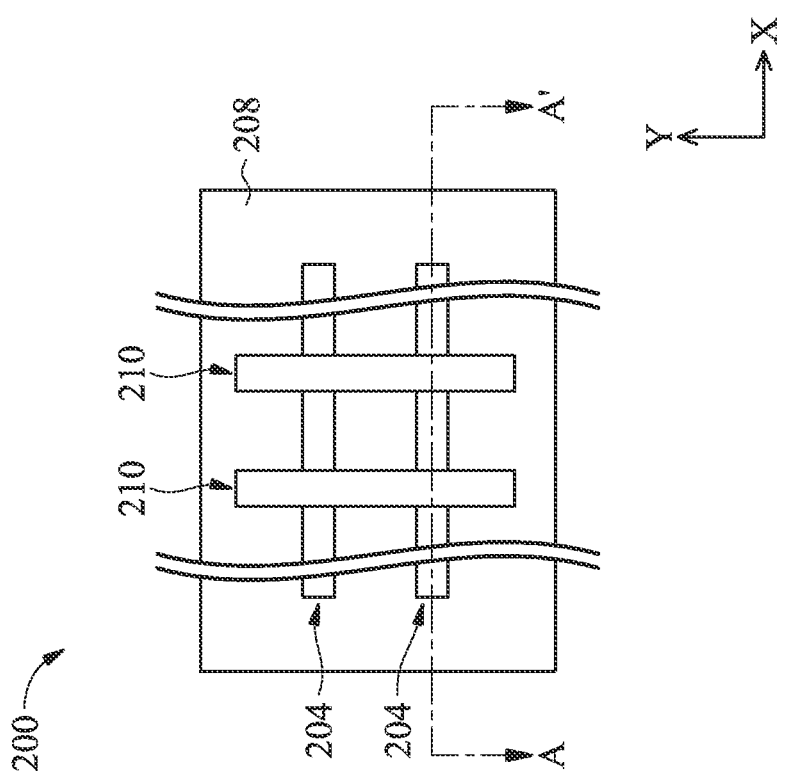
FIG. 2B is a portion of a plane top view of an embodiment of a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as planar FETs or three-dimensional fin-line FETs (FinFETs).

In FETs, gate spacer(s) disposed on sidewalls of gate structures (e.g., high-k metal gate structures, or HKMGs) and interlayer dielectric (ILD) layer disposed over source/drain (S/D) features are generally formed in proximity with each other, such that processing one may inadvertently affect the structure and performance of the other. For example, after performing a gate replacement process, the ILD layer may be etched back to accommodate subsequent processing of the FETs (e.g., forming gate contacts). During such etching process, due to the reduced feature sizes and close proximity to nearby gate spacer, portions of the gate spacer may be inadvertently damaged (e.g., shortened), potentially causing shorting issues between the gate structure and other conductive components (e.g., subsequently formed S/D contacts) of the FET. For this and other reasons, improvements are needed for mitigating the effect of etching the ILD layer on the gate spacer during FET fabrication processes.

Referring now to FIG. 1, a flow chart of a method 100 of forming a semiconductor device 200 is illustrated according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-12, which illustrate a portion of the semiconductor device 200 during the method 100. FIGS. 3-12 are cross-sectional views of the device 200 taken along the dashed line AA' shown in FIGS. 2A and 2B at intermediate steps of the method 100. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 2A:
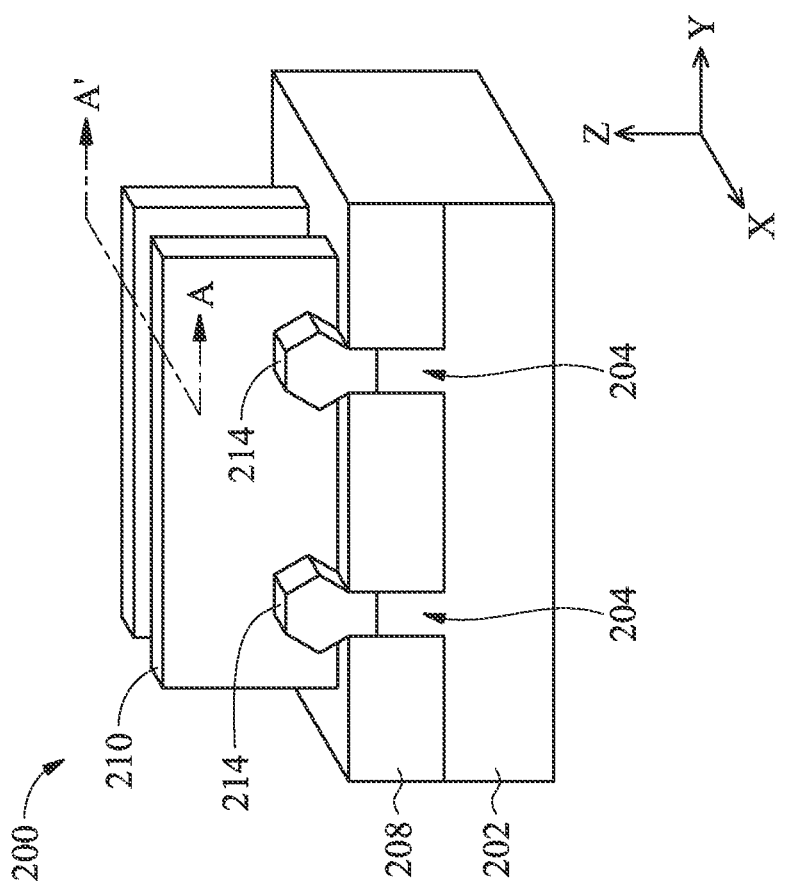
FIG. 2A is a perspective view of an embodiment of a semiconductor device according to various aspects of the present disclosure.

At operation 102, referring to FIGS. 1, 2A, and 2B, the method 100 forms a device 200 including a substrate 202 having a semiconductor layer 204 (e.g., an active region such as a three-dimensional fin; hereafter referred to as the fin 204) formed thereon, a dummy gate structure 210 formed over the semiconductor layer 204, isolation structures 208 formed over the substrate 202 separating various components of the device 200, source/drain (S/D) features 214 formed over the fin 204 and interposed between adjacent dummy gate structures 210 as depicted in a top view in FIG. 2B. As depicted herein, the device 200 may include multiple fins 204 oriented lengthwise along the X direction and multiple dummy gate structure 210 oriented lengthwise along the Y direction, i.e., generally perpendicular to the fins 204. In many embodiments, as will be discussed in detail below, the device 200 includes additional features such as gate spacers disposed along sidewalls of the dummy gate structures 210, hard mask layer(s) disposed over the dummy gate structures 210, and numerous other features. For purpose of simplicity, intermediate steps of the method 100 are hereafter described with reference to cross-sectional views (FIGS. 3-12) of the device 200 taken along a length of the fin 204 (i.e., the dashed line AA' in the X direction).

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonideor, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with p-type dopants, such as phosphorus or arsenic, and/or n-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 2A and 2B, the device 200 may provide one or more n-type FET (nFET) device and/or one or more p-type FET (pFET) device. The fins 204 may be fabricated using suitable processes including photolithography and etch processes. The photolithography process may include forming a photoresist layer (resist; not shown) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), other suitable processes, or combinations thereof.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers.

Thereafter, referring to FIGS. 1, 2A, and 3, the method 100 at operation 102 forms dummy gate structures 210 that engage the fins 204 on three sides of a channel region of each fin 204. In at least one embodiment, portions of each dummy gate structure 210 will be replaced with a high-k metal gate structure (HKMG) after other components of the device 200 are fabricated. Each dummy gate structure 210 may include one or more material layers, such as an interfacial layer, a dummy gate dielectric layer, a dummy gate electrode including poly-silicon, a hard mask layer, a capping layer, other suitable layers, or combinations thereof. In the depicted embodiment, a hard mask layer 212 is formed over the dummy gate structure 210. In some embodiments, the hard mask layer 212 is configured to protect the dummy gate structure 210 from subsequent operations of the method 100 and may be removed during a later fabrication process. The hard mask layer 212 may include any suitable dielectric material, such as a nitrogen-containing dielectric material, an oxygen-containing dielectric material, other suitable materials, or combinations thereof. The hard mask layer 212 and various material layers included in the dummy gate structure 210 may be formed by any suitable method, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), plasma enhanced CVD (PE-CVD), low-pressure CVD (LP-CVD), atomic layer CVD (AL-CVD), atmospheric pressure CVD (AP-CVD), other suitable methods, or combinations thereof. In one embodiment, the dummy gate structure 210 is first deposited as a blanket layer. The blanket layer is then patterned through a series of lithography and etching processes, thereby removing portions of the blanket layer and keeping the remaining portions over the isolation structures 208 and the fins 204 as the dummy gate structures 210.

The method 100 at operation 102 subsequently forms gate spacer layers 220 and 222 on sidewalls of the dummy gate structures 210. Each of the gate spacer layers 220 and 222 may be a single-layered structure or a multi-layered structure. In the depicted embodiment, the device 200 includes two gate spacer layers, though the present disclosure is not limited to this configuration and may, for example, include only the gate spacer layer 222 or one or more gate spacer layers in addition to the gate spacer layers 220 and 222. In many embodiments, the gate spacer layer 222 includes at least silicon (Si), oxygen (O), nitrogen (N), and carbon (C). In further embodiments, the gate spacer layer 222 includes about 70% to about 95% (e.g., atomic percentage) of silicon oxide, and about 0 to about 5% of C. In some embodiments, the gate spacer layer 222 also includes about 5% to about 30% of silicon nitride. In one example, the gate spacer layer may be substantially free of C (e.g., less than about 1% of C). In some embodiments, the amount of Si and O included in the gate spacer layer 222 is at least the same as the amount of Si and O included in a subsequently formed interlayer dielectric (ILD) layer (e.g., ILD layer 250). In the depicted embodiment, both gate spacer layers 220 and 222 include a dielectric material comprising Si, O, C, and N; however, the amount of C included in the gate spacer layer 222 is less than the amount of C included in the gate spacer layer 220. In other words, the amount of Si and O included in the gate spacer layer 222 is greater than the amount of Si and O included in the gate spacer layer 220. As will be discussed below, because the ILD layer 250 substantially comprises Si and O in the form of silicon oxide (e.g., at an amount greater than about 99% by weight), an etching selectivity between the gate spacer layer 220 and the ILD layer 250 with respect to a given etchant (e.g., HF and/or $NH_3$) is greater than an etching selectivity between the gate spacer layer 222 and the ILD layer 250. In other words, etching the ILD layer 250 is more likely to etch at least a portion of the gate spacer layer 222 than the gate spacer layer 220, thereby inadvertently damaging the gate spacer layer 222.

The method 100 may form the gate spacer layer 220 by first depositing a blanket of spacer material over the device 200 by a method such as CVD, PVD, ALD, other suitable methods, or combinations thereof, and then performing an anisotropic etching process to remove portions of the spacer material to form the gate spacer layer 220 on sidewalls of the dummy gate structure 210. The gate spacer layer 222 is subsequently formed by a similar process.

Referring still to FIGS. 1, 2A, and 3, the method 100 at operation 102 subsequently forms the S/D features 214 in the fins 204 and adjacent to the dummy gate structures 210. The S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution or other suitable solution(s). Subsequently, one or more epitaxial growth processes are performed to grow epitaxial features in the recesses. Each of the S/D features 214 may be suitable for a p-type FinFET (e.g., a p-type epitaxial material) or alternatively, an n-type FinFET (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

Thereafter, the method 100 at operation 102 forms a contact etch-stop layer (CESL) 224 over the device 200, such that the CESL 224 is formed over the hard mask layer 212, the gate spacer layers 220 and 222, the S/D features 214, and the isolation structure 208 (omitted in FIGS. 3-10 for purpose of simplicity). The CESL 224 may include silicon nitride, silicon oxynitride, silicon nitride with oxygen or carbon elements, other materials, or combinations thereof, and may be formed by CVD, PVD, ALD, other suitable methods, or combinations thereof. In many embodiments, the CESL 224 has a composition different from that of the gate spacer layer 222, such that an etching selectivity between the two layers may be improved.

Referring to FIGS. 1 and 4, the method 100 at operation 104 performs an implantation process 230 to the device 200. In many embodiments, the implantation process 230 introduces Si atoms into an upper portion of the gate spacer layer 222 to form a Si-rich layer 232. In alternative embodiments, the implantation process 230 introduces Ge atoms into the upper portion of the gate spacer layer 222 to form a Ge-rich layer. In an example embodiment, the implantation process 230 includes bombarding the upper portion of the gate spacer layer 222 with a Si-containing material such as $SiH_4$ at a concentration of about 3E15 atoms/$cm^2$, and the implantation energy may be about 2 keV. Of course, the present disclosure is not limited to this set of implantation conditions. The implantation process 230 may be implemented using a tilted dosage source of a Si-containing species, such as $SiF_4$. The use of tilted dosage source ensures that the implantation process is implemented on desired portions of the device 200 (e.g., an upper portion of the gate spacer layer 222). In many embodiments, the extent of the implantation (i.e., bombardments of Si ions) is controlled by varying an angle 234 of the titled dosage source to be from about 5 degrees to about 15 degrees with respect to the Z direction. A specific value for the angle 234 may be chosen based on a desired depth of implantation. In some examples, if the angle 234 is less than about 5 degrees, the depth of implantation may be too shallow to accommodate subsequent fabrication processes. Similarly, if the angle 234 is greater than about 15 degrees, the depth of implantation may also be too shallow. The depth of implantation is configured to be deep enough such that a bottom surface of the Si-rich layer 232 extends to below a top surface of the dummy gate structure 210. In an example embodiment, energy implemented for the implantation process 230 is about 2 keV. However, other energy levels may also be applicable for purposes of the present disclosure.

In many embodiments, the implantation process 230 is configured to introduce molecular disorder to the structure of the gate spacer layer 222 in preparation for subsequent processing steps. In some embodiments, bombardment of Si atoms is configured to amorphize the molecular structure of the gate spacer layer 222 during the implantation process 230. Additionally or alternatively, bombardment of Si atoms is configured to create dangling bonds within the molecular structure of the gate spacer layer 222 during the implantation process 230. For at least these reasons, atoms similar to Si in terms of mass and size, such as Ge atoms, may also be used for the implantation process 230. As will be discussed in detail below, molecular disorder and/or dangling bonds may accommodate subsequent implantation process for introducing atoms such as C into the Si-rich layer 232.

Figure 5:
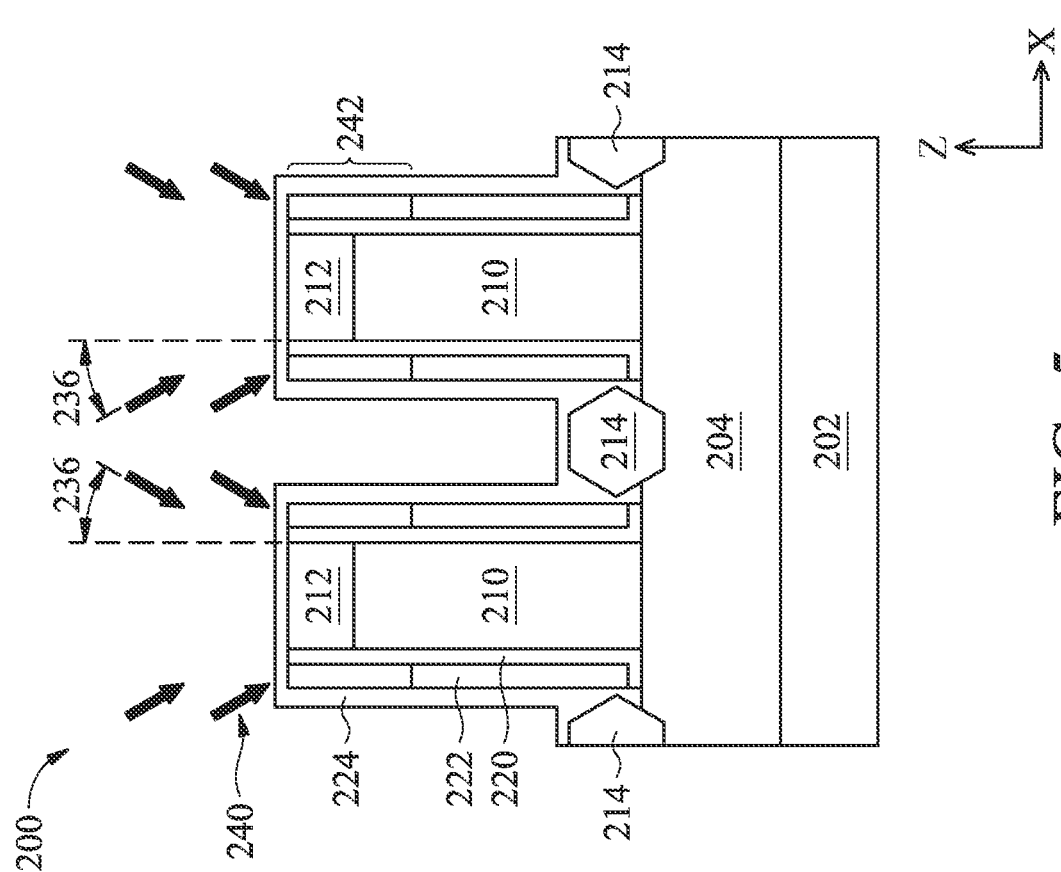

Referring to FIGS. 1 and 5, the method 100 at operation 106 performs an implantation process 240 to the device 200. In many embodiments, the implantation process 240 introduces C atoms into the Si-rich layer 232 in the gate spacer layer 222, thereby forming a Si-and-C-rich layer 242. The implantation process 240 may be similar to the implantation process 230 in that it is implemented using a dosage source of a C-containing species, such as $CO_2$, tilted at an angle 236. In many embodiments, the angle 236 is substantially similar to the angle 234 and ranges from about 5 degrees to about 15 degrees with respect to the Z direction, such that a depth of implantation of C atoms is substantially similar to the depth of implantation of Si atoms at implantation process 230. In other words, the Si-and-C-rich layer 242 is similar in thickness to the Si-rich layer 232. In some examples, the angle 236 may be within about 2 degrees of the angle 234. In an example embodiment, the energy implemented for the implantation process 240 may be about 1 keV. However, other energy levels may also be applicable for purposes of the present disclosure.

In many embodiments, the implantation process 240 is configured to increase an amount of C atoms in the gate spacer layer 222 (i.e., the amount of C in the Si-and-C-rich layer 242 is from about 10% to about 15% C, while the portion of the gate spacer layer 222 below the Si-and-C-rich layer 242 is from about 0 to about 5% C) and encourage the formation of Si—C bonds in the upper portion of the gate spacer layer 222. In some embodiments, the amount of C atoms in the Si-and-C-rich layer 242 is at least about 10%, a threshold above which, as discussed below, the etching selectivity of the gate spacer layer 222 is improved relative to the subsequently formed ILD layer 250. The Si—C bonds included in the Si-and-C-rich layer 242 help reduce loss of the gate spacer layer 222 during subsequent etching processes (e.g., as a part of gate replacement process and/or interlayer dielectric layer removal process). Reasons for such reduction may be two-fold. First, the increase in the amount of C atoms compositionally differentiates the gate spacer layer 222 from the subsequently formed ILD layer (e.g., the ILD layer 250) by increasing the amount C included, thereby increasing an etching selectivity between the gate spacer layer 222 and the ILD layer 250 (i.e., the Si-and-C-rich layer 242 includes a greater amount of C atoms than the ILD layer 250). As discussed above, the gate spacer layer 222 includes about 70% to about 95% of silicon oxide, while the ILD layer generally includes pure (e.g., greater than about 99% by weight) silicon oxide (discussed in detail below). Second, the formation of Si—C bonds chemically improves the etching resistance of the gate spacer layer 222 against etchant(s) (e.g., hydrofluoric acid, ammonia, etc.) of the dry etching process(es) employed for etching the ILD layer 250. In some examples, implanting N atoms in the gate spacer layer 222 may also help compositionally differentiate the gate spacer layer 222 from the ILD layer; however, because the gate spacer layer 222 generally includes more N (e.g., about 5% to about 30% of silicon nitride) than C (e.g., about 0 to about 5%), the effect of implanting N atoms may not be as profound as compared to implanting C atoms for reasons stated above.

In many embodiments, bombarding the gate spacer layer 222 with Si atoms during the implantation process 230 before implanting C atoms creates dangling Si bonds within the Si-rich layer 232, thus increasing the amount of C that can be accommodated during the implantation process 240. Additionally or alternatively, in some examples, C atoms may be accommodated within vacancy sites made available in the Si-rich layer 232 as a result of the molecular disorder introduced by the bombardment of Si atoms. Therefore, in the present disclosure, many embodiments provide that Si atoms are implanted before C atoms, and a reversal of such order would not achieve the desired results as discussed in detail below. The overall increase of the amount of C atoms promotes the formation of Si—C bonds for improved material property (e.g., etching resistance) of the gate spacer layer 222 as well as an etching selectivity of the gate spacer layer 222 relative to the subsequently formed ILD layer 250. In some embodiments, dosage levels of the Si and C may be similar or different but is each at least $1 \times 10^{16}$, which is a critical dosage for forming Si—C bonds to improve etching resistance of the gate spacer layer 222. In some embodiments, the etching selectivity of the gate spacer layer 222 is maximized when the dosage levels of the Si and C are substantially similar in order to ensure maximal amount of dangling bonds created by the bombardment of Si atoms. The present disclosure, of course, is not limited to the specific dosage levels of Si and C as depicted herein.

Figure 6:
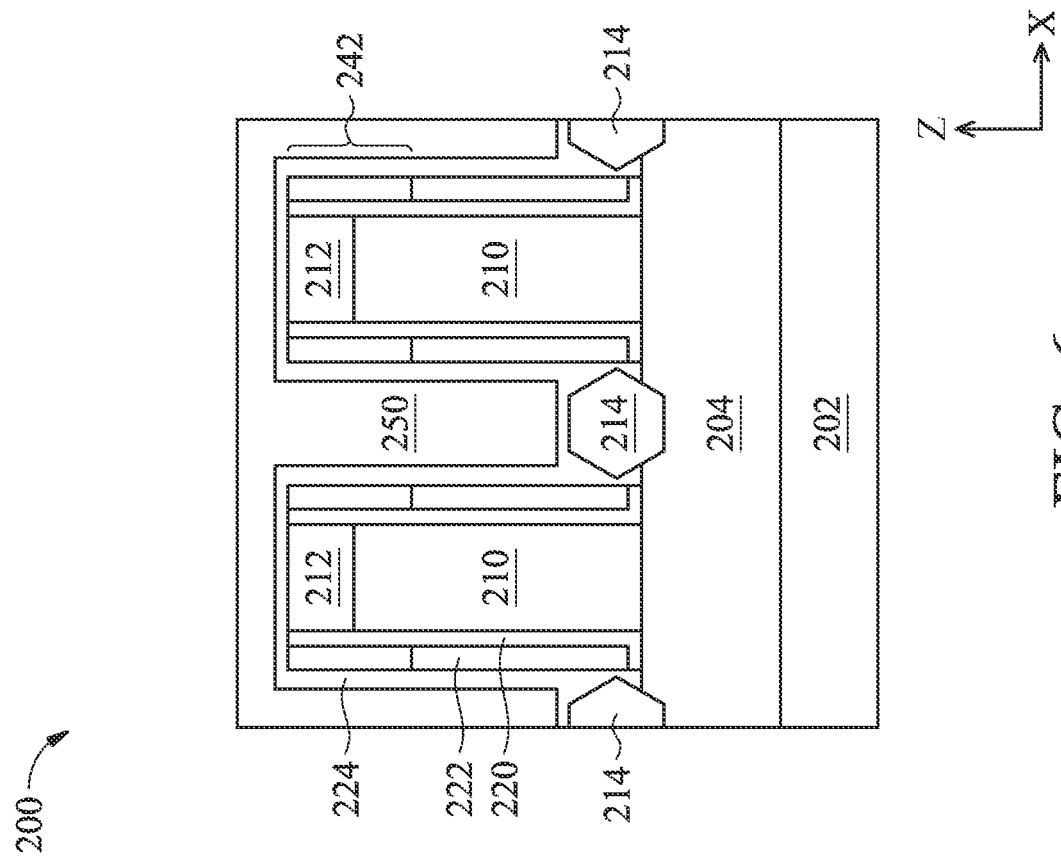
Figures 7, 8:
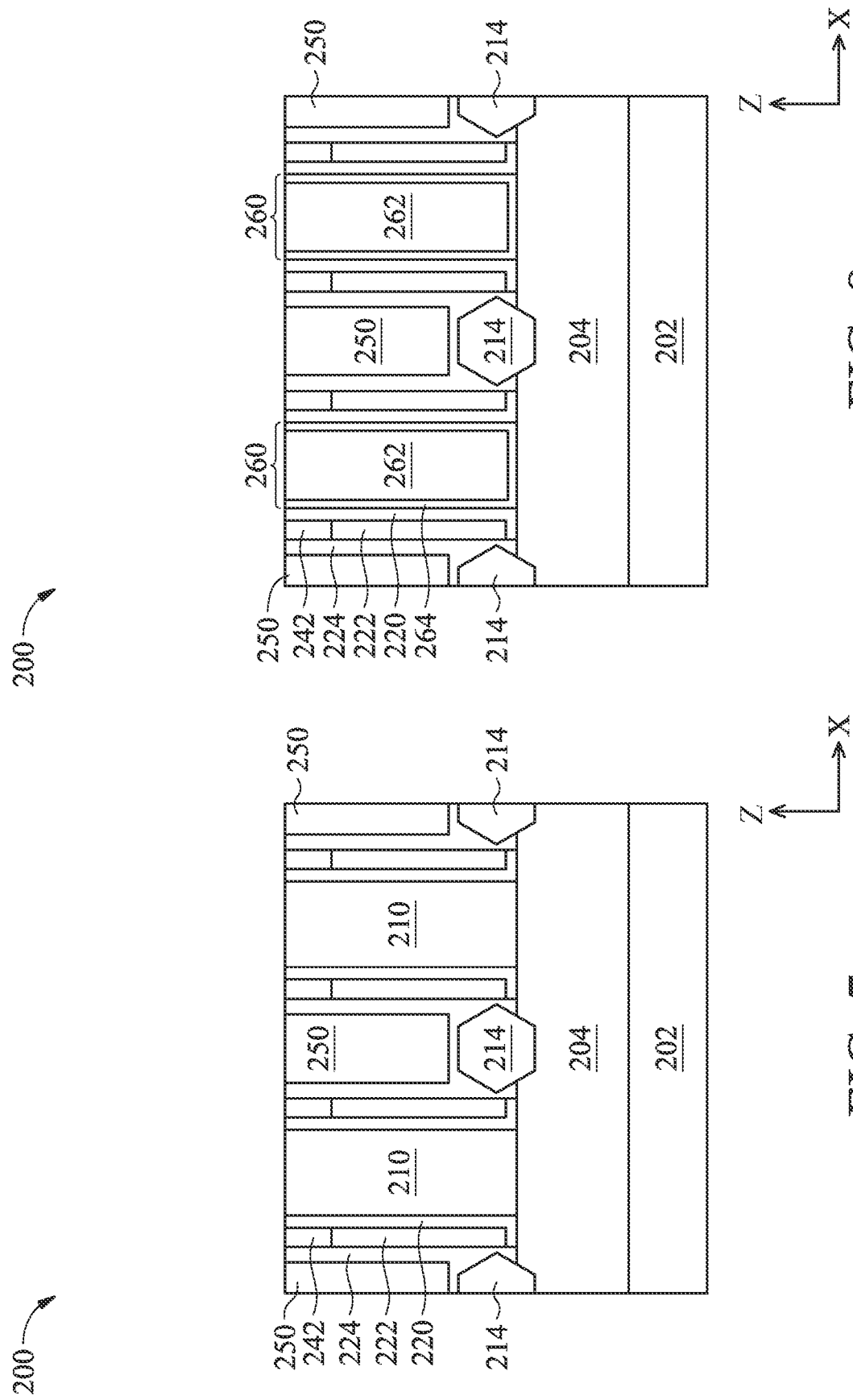
Figure 10:
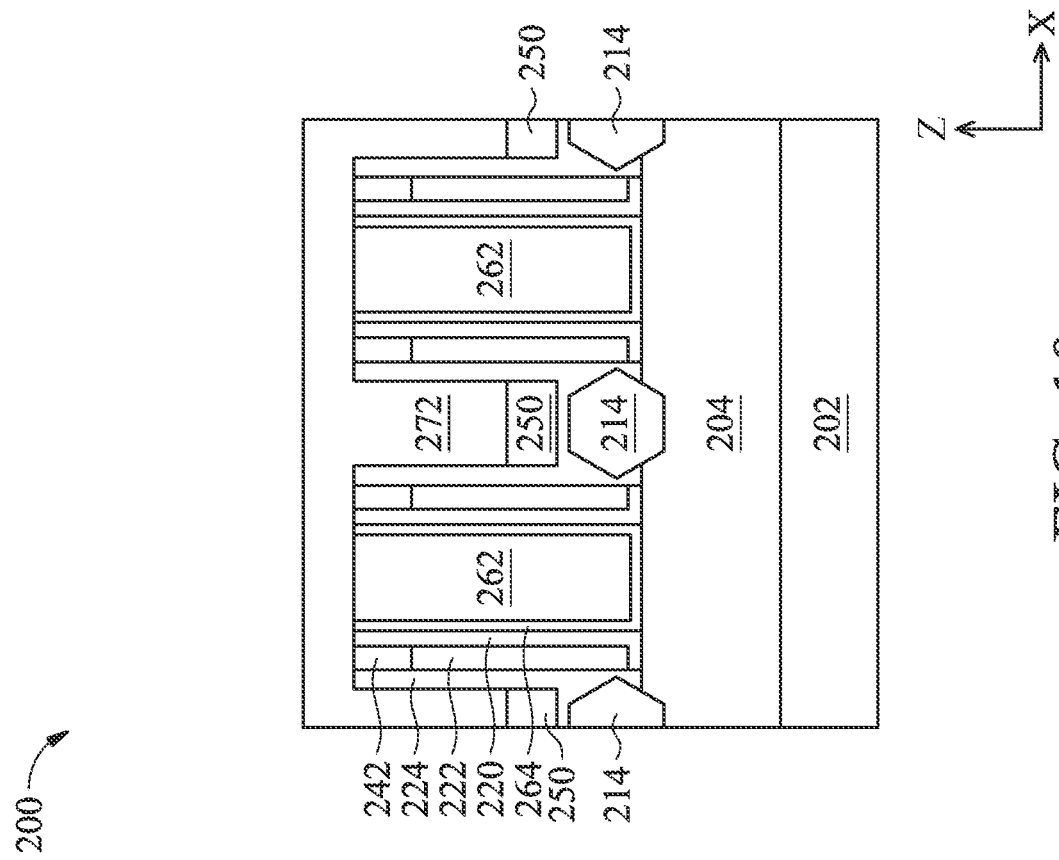

Referring to FIGS. 1, 6, and 7, the method 100 at operation 108 forms the ILD layer 250 over the device 200. The ILD layer 250 may include any suitable dielectric material, such as silicon oxide ($SiO_2$), tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 250 may include a multi-layer structure having multiple dielectric materials and may be formed by a deposition process such as, for example, CVD, PVD, ALD, flowable CVD (FCVD), other suitable methods, or combinations thereof. Referring to FIG. 7, after forming the ILD layer 250, a planarization process such as CMP may be performed such that top portions of the dummy gate structures 210 are exposed (e.g., the hard mask layer 212 is removed by the CMP process).

In many embodiments of the present disclosure, the ILD layer 250 includes a dielectric material that includes at least Si and O in the form of, for example, silicon oxide, and may further include other elements at a significantly lower concentration than silicon oxide. In further embodiments, an amount of Si and O included in the ILD layer 250 exceeds or is at least the same as the amount of Si and O in the gate spacer layer 222. In an example embodiment, the ILD layer 250 includes pure silicon oxide in which the amount of silicon oxide is at least 99% by weight. Therefore, if a nearby component (e.g., the gate spacer layer 222) includes a similar amount of silicon oxide and/or trace amount (e.g., about 0 to about 5%) of other elements such as C, an etching selectivity between the ILD layer 250 and the gate spacer layer 222 with respect to a given etchant (e.g., HF and/or $NH_3$) may be too low to prevent loss of the gate spacer layer 222 when the ILD layer 250 is etched. For example, the etching selectivity between the ILD layer 250 and the gate spacer layer 222 with respect to a given etchant may be improved by increasing the amount of C to be from about 10% to about 15% by implementing the implantation process 240 as discussed above. Accordingly, an objective of the present disclosure is to improve the etching selectivity of a gate spacer layer in proximity to an ILD layer, such that undesired loss of the gate spacer layer may be reduced or minimized.

Referring to FIGS. 1 and 8, the method 100 at operation 110 replaces at least portions of the dummy gate structures 210 to form HKMGs 260. In some embodiments, replacing at least portions of the dummy gate structures 210 includes performing an etching process that selectively removes the dummy gate structures 210 to form gate trenches (not depicted). The etching process may be a dry etching process, a wet etching process, an RIE, other suitable methods, or combinations thereof. The dry etching process may use a chlorine-containing gas, a fluorine-containing gas, a bromine-containing gas, oxygen, other suitable etching gases, or combinations thereof. The wet etching solutions may include ammonium hydroxide ($NH_4OH$), hydrofluoric acid (HF) or diluted HF, deionized water, tetramethylammonium hydroxide (TMAH), other suitable wet etching solutions, or combinations thereof. The etching process may be tuned such that the dummy gate structures 210 are etched at a higher rate relative to other components of the device 200.

Thereafter, still referring to FIGS. 1 and 8, the method 100 at operation 110 forms HKMGs 260 in the gate trenches. The HKMGs 260 each includes at least a high-k dielectric layer 264 (i.e., having a dielectric constant greater than that of silicon oxide, which is approximately 3.9) and a gate electrode 262, which may further include at least one work function metal layer (not depicted) and a bulk conductive layer (not depicted). The high-k dielectric layer 264 may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The work function metal layer may include a p-type or an n-type work function material, such as TiN, TaN, Ru, Mo, Al, WN, $ZrSi_2$, $MoSi_2$, $TaSi_2$, $NiSi_2$, WN, Ti, Ag, TaAl, TaAlC, TiAlN, TaC, TaCN, TaSiN, Mn, Zr, other suitable materials, or combinations thereof. The bulk conductive layer may include Cu, W, Al, Ru, Co, other suitable metals, or combinations thereof. Each of the HKMGs 260 may further includes numerous material layers, such as an interfacial layer, a barrier layer, a hard mask layer, other suitable layers, or combinations thereof. Various material layers of the HKMG 260 may be formed by chemical oxidation, CVD, ALD, PVD, FCVD, plating, other suitable methods, or combinations thereof. Thereafter, one or more CMP process may be performed to remove excess materials from the HKMGs 260 so as to planarize a top surface of the device 200.

Figure 9:
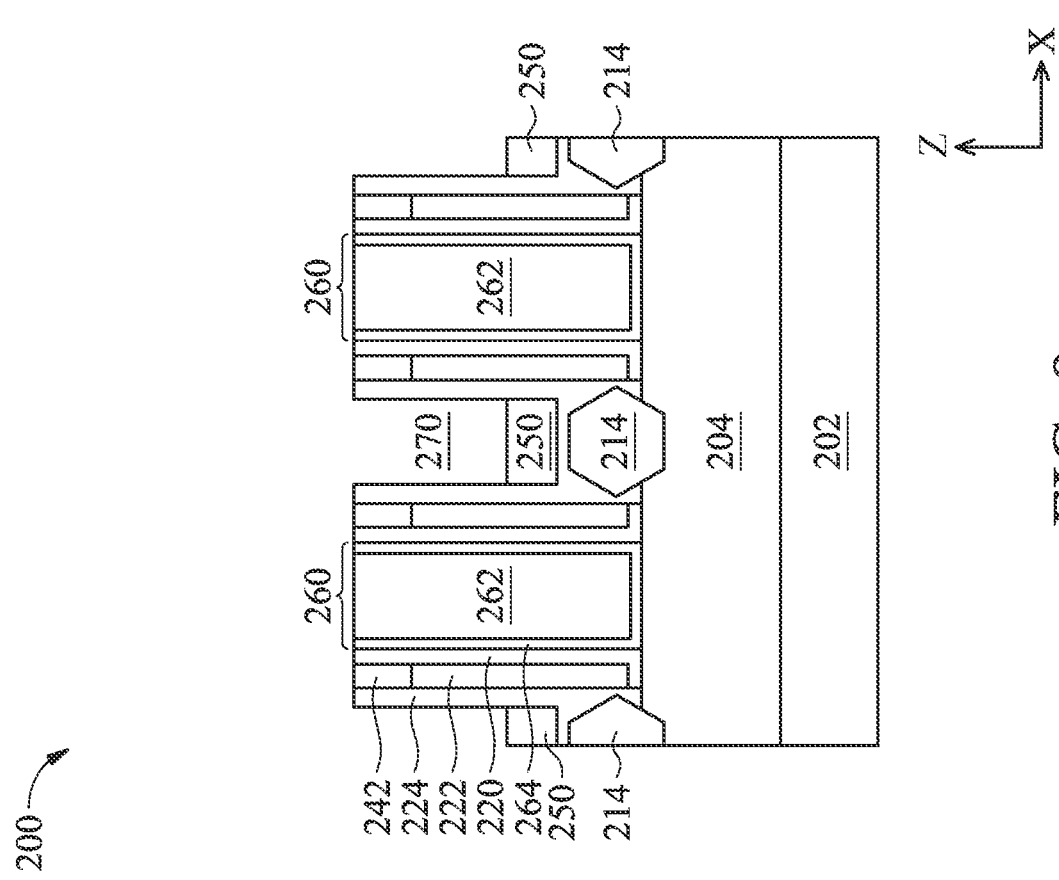

Referring to FIGS. 1 and 9, the method 100 at operation 112 recesses portions of the ILD layer 250 to form a trench 270. The ILD layer 250 may be etched by any suitable process, such as a dry etching process, a wet etching process, RIE, other suitable etching processes. In some embodiments, a dry etching process is performed using one or more suitable etchant, such as a fluorine-containing etchant (e.g., hydrofluoric acid or HF), a nitrogen-containing etchant (e.g., ammonia or $NH_3$), other suitable etchants, or combinations thereof. In many embodiments, the etching process at operation 112 selectively removes portions of the ILD layer 250 relative to the CESL 224, the gate spacer layers 220 and 222, the Si-and-C-rich layer 242, and the HKMGs 260, which may only be minimally etched or not etched at all. In other words, the ILD layer is etched at a higher rate than other components of the device 200. In some embodiments, the ILD layer 250 is removed completely removed from the device 200, such that the CESL 224 is exposed in the trench 270. Notably, due to the Si-and-C-rich layer 242 formed in the upper portion of the gate spacer layer 222, the etching selectivity and the etching resistance of the gate spacer layer 222 relative to the ILD layer 250 has been increased. In other words, the loss of the gate spacer layer 222 during the etching of the ILD layer 250 is reduced because of the presence of the Si-and-C-rich layer 242. In one example, the increase in etching selectivity between the gate spacer layer 222 and the ILD layer 250 may be improved by at least four-fold, and such etching selectivity may be improved even further if the implantation dosage of the Si and the C atoms are substantially similar as discussed above. In the depicted embodiment, after the etching process at operation 112, a height of the gate spacer layer 222 including the Si-and-C-rich layer 242 is greater than a height of the gate spacer layer 222 had there not been any Si-and-C-rich layer 242.

Figure 11A:
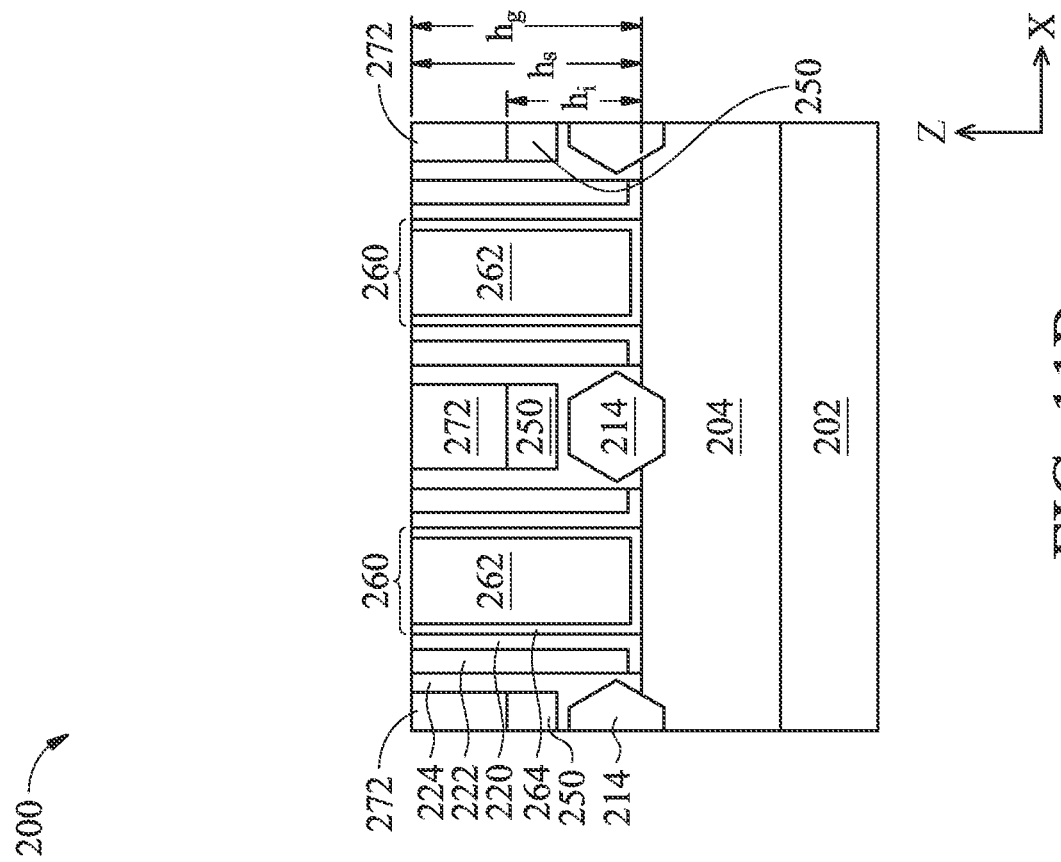
Figure 11B:
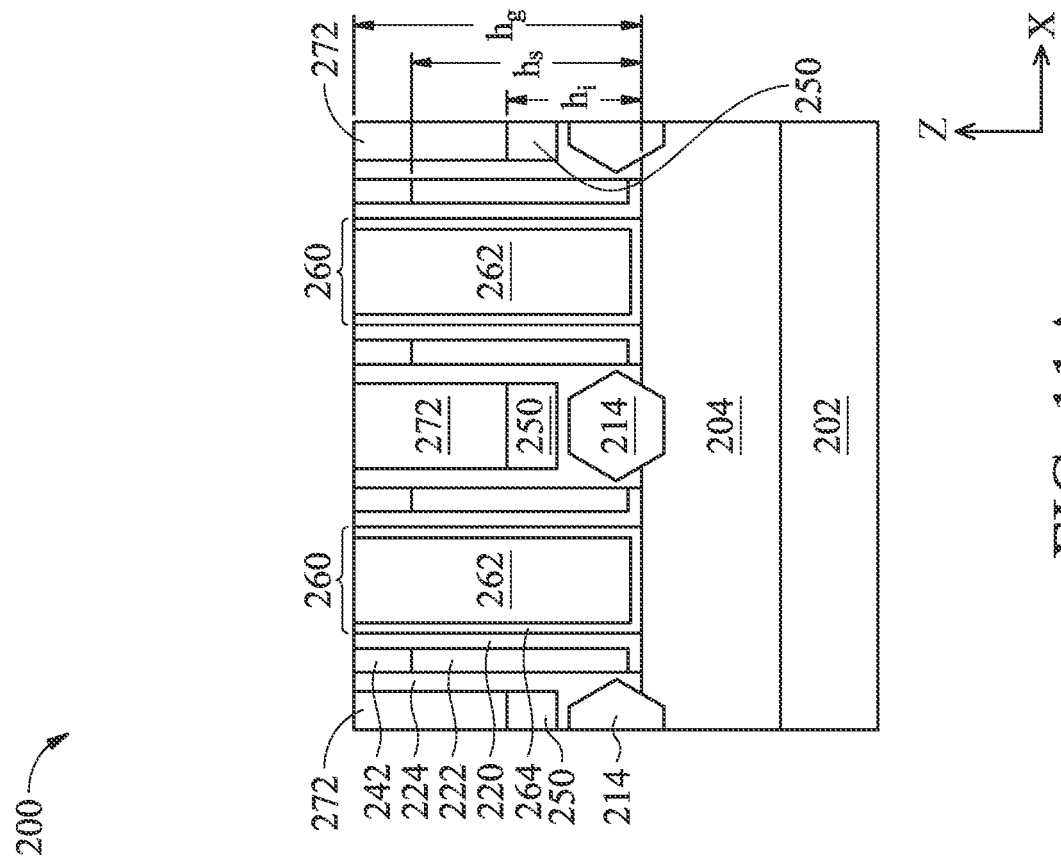

Referring to FIGS. 1, 10, 11A, and 11B, the method 100 at operation 114 deposits a dielectric layer 272 in the trench 270. The dielectric layer 272 includes any suitable material that is different from the dielectric material included in the ILD layer 250. In some embodiments, the dielectric layer 272 includes a nitride (e.g., silicon nitride, a metal nitride, etc.), which may further include other elements such as O, C, other suitable elements, or combinations thereof. The dielectric layer 272 may be formed by any suitable method, such as PVD, CVD, FCVD, ALD, other suitable methods, or combinations thereof. Thereafter, referring to FIGS. 11A and 11B, one or more CMP process may be implemented to remove excess dielectric layer 272 and planarize the top surface of the device 200. In some embodiments, the dielectric layer 272 is configured to facilitate subsequent fabrication steps for forming gate contacts, such as forming self-aligned gate contacts and/or protecting the S/D features 214 when forming the S/D contacts (discussed in detail below). At least a portion of the Si-and-C-rich layer 242 may remain in the device 200 after the CMP process(es) as depicted in FIG. 11A or, alternatively, it may be removed from the device 200 by the CMP process(es) as depicted in FIG. 11B. In some examples, the height of the Si-and-C-rich layer 242 may be from about 10 nm to about 15 nm. In some examples, the height of the Si-and-C-rich layer 242 may be about 10% the height of the HKMG 260. In other words, the CMP process(es) may remove a portion of the Si-and-C-rich layer 242 from the device 200 at operation 114. In many embodiments, the difference between the height $h_g$ of the HKMG 260 (measured from a top surface of the HKMG 260 to a bottom surface thereof) and the height $h_s$ of the gate spacer layer 222 (measured from a top surface of the portion of the gate spacer layer 222 below the Si-and-C-rich layer 242 to a bottom surface of the HKMG 260) is less than about one half of the difference between the height $h_s$ and the height $h_i$ (measured from a top surface of the ILD layer 250 to a bottom surface of the HKMG 260). In one example, the difference between the height $h_g$ and the height $h_s$ is less than about 10 nm, and the difference between the height $h_s$ and the height $h_i$ is at least about 20 nm.

Figure 12:
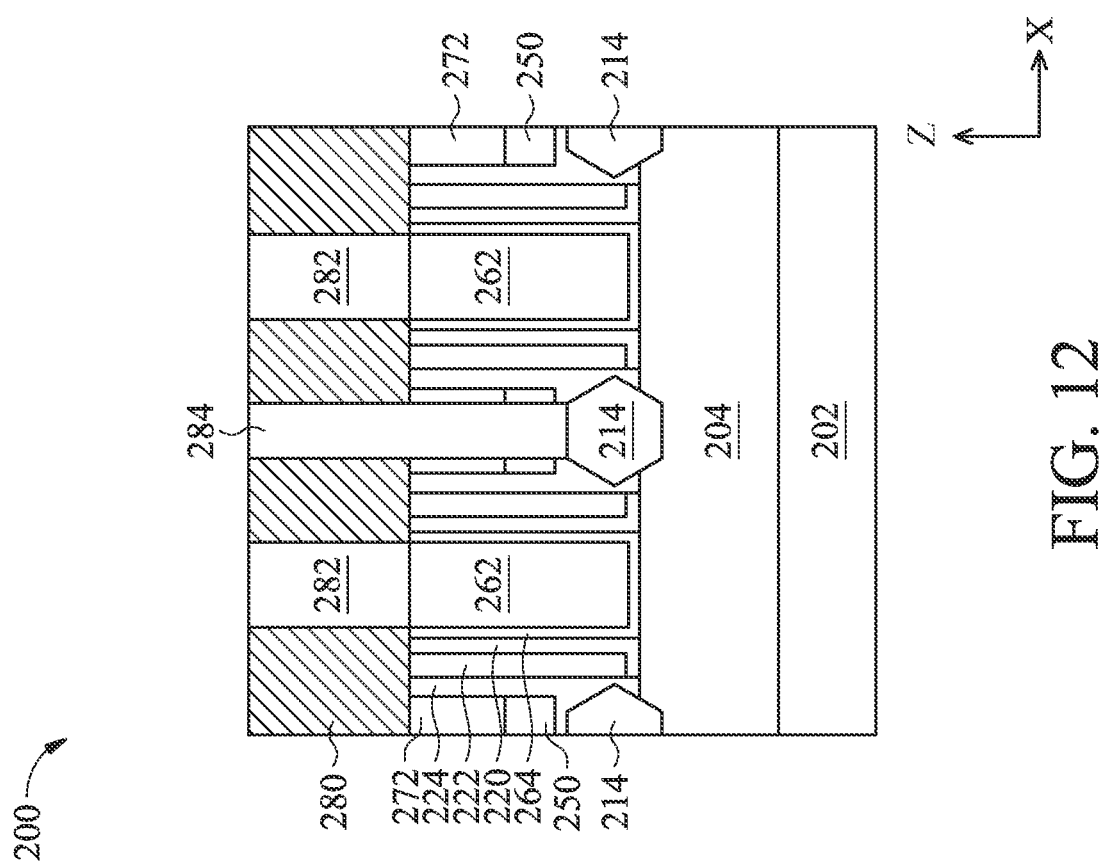

Referring to FIGS. 1 and 12, the method 100 at operation 116 performs additional processing steps. For example, gate contacts 282 (e.g., self-aligned gate contacts) may be formed over the HKMGs 260. The gate contacts 282 may be formed by first depositing an ILD layer 280 over the device 200. The ILD layer 280 is then patterned and etched to form gate contact trenches (not depicted), which are then filled with a conductive material (e.g., W, Cu, Al, Co, Ru, etc.) by any suitable method (e.g., CVD, ALD, PVD, plating, etc.) to form the gate contacts 282. Additional material layers such as barrier layers may be formed in the gate contact trenches before depositing the conductive material. S/D contact 284 may also be formed over the S/D features 214 by a series of patterning, etching, and deposition processes similar to those discussed above with respect to the gate contacts 282. In some embodiments, a silicide layer (not depicted) is formed by any suitable method over the S/D feature 214 before forming the S/D contact 284. Additional vertical interconnect features such as contacts and/or vias, and/or horizontal interconnect features such as lines, and multilayer interconnect features such as metal layers and interlayer dielectrics may then be formed over the device 200. The various interconnect features may implement various conductive materials including Cu, W, Co, Al, Ti, Ta, Pt, Mo, Ag, Au, Mn, Zr, Ru, their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

Although not intended to be limiting, one or more embodiments of the present disclosure provide many benefits to a semiconductor device and the formation thereof. For example, embodiments of the present disclosure provide methods of reducing gate spacer loss by implementing a two-step implantation process to the gate spacer material. By implanting both Si and C atoms in the gate spacer material and in that order, embodiments of the present disclosure form a SiC-rich layer in an upper portion of the gate spacer, which increases the etching selectivity relative to an ILD layer disposed in proximity to the gate spacer.

One aspect of the present disclosure pertains to a method of fabricating an integrated circuit (IC) structure. The method includes forming a gate spacer on sidewalls of a dummy gate structure disposed over a semiconductor substrate; performing a first implantation process to the gate spacer, wherein the first implantation process includes bombarding an upper portion of the gate spacer with silicon atoms; after performing the first implantation process, performing a second implantation process to the upper portion of the gate spacer, wherein the second implantation process includes bombarding the upper portion of the gate spacer with carbon atoms; and after performing the second implantation process, replacing the dummy gate structure with a high-k metal gate structure, wherein the replacing includes forming an interlayer dielectric (ILD) layer.

Another one aspect of the present disclosure pertains to a method of fabricating an integrated circuit (IC) structure. The method includes forming a semiconductor structure including a dummy gate structure, a gate spacer disposed on sidewalls of the dummy gate structure, and source/drain (S/D) features disposed adjacent the dummy gate structure; performing a silicon-based implantation to an upper portion of the gate spacer to form a silicon-rich layer; performing a carbon-based implantation to the silicon-rich layer to form a SiC-rich layer; depositing an interlayer dielectric (ILD) layer over the S/D features and on the gate spacer, wherein the ILD layer includes silicon oxide; after depositing the ILD layer, forming a high-k metal gate structure (HKMG) in place of the dummy gate structure; and after forming the HKMG, recessing the ILD layer.

Yet another aspect of the present disclosure pertains to a method that includes implanting silicon atoms in a gate spacer disposed on sidewalls of a dummy gate structure to form a silicon-rich layer in an upper portion of the gate spacer, wherein the dummy gate structure is adjacent a source/drain (S/D) feature; implanting carbon atoms in the silicon-rich layer to form a silicon carbon-rich layer; forming a high-k metal gate structure in place of the dummy gate structure, wherein the forming includes depositing an interlayer dielectric (ILD) layer, and wherein the ILD layer includes less carbon than the silicon carbon-rich layer of the gate spacer; recessing the ILD layer to form a trench over the S/D feature; and forming a dielectric layer in the trench.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dummy gate structure over a semiconductor fin that protrudes from a substrate;
    forming a gate spacer on a sidewall of the dummy gate structure, wherein the forming of the gate spacer includes depositing a spacer layer over the substrate and recessing the spacer layer to form the gate spacer on the sidewall of the dummy gate structure;
    forming source/drain (S/D) features in the semiconductor fin and adjacent to the gate spacer;
    after forming the S/D features, performing a silicon implantation process to an upper portion of the gate spacer using a first dosage source including silicon, thereby forming a silicon-implanted upper portion of the gate spacer;
    after performing the silicon implantation process, performing a carbon implantation process to the silicon-implanted upper portion of the gate spacer using a second dosage source including carbon, thereby increasing concentration of carbon in the silicon-implanted upper portion of the gate spacer with respect to a lower portion, wherein the second dosage source is different from the first dosage source;
    forming an interlayer dielectric (ILD) layer over the carbon-implanted upper portion of the gate spacer;
    replacing the dummy gate structure with a high-k metal gate structure, wherein the high-k metal gate structure is disposed in the ILD layer; and
    forming a dielectric layer in the ILD layer and over the S/D features.

2. The method of claim 1, wherein the forming of the dielectric layer includes:
    recessing a portion of the ILD layer to form a trench adjacent to the high-k metal gate structure; and
    forming the dielectric layer in the trench, wherein the dielectric layer includes a nitride material.

3. The method of claim 2, wherein the recessing of the ILD layer includes implementing a dry etching process using hydrofluoric acid, ammonia, or a combination thereof as an etchant.

4. The method of claim 2, wherein the forming of the dielectric layer in the trench includes:
    depositing the dielectric layer over the ILD layer in the trench; and
    performing a chemical-mechanical polishing (CMP) process to the dielectric layer deposited in the trench.

5. The method of claim 1, wherein the forming of the gate spacer includes forming the gate spacer that includes silicon and oxygen, and wherein an amount of silicon and oxygen included in the gate spacer is the same as an amount of silicon and oxygen included in the ILD layer.

6. The method of claim 1, wherein the performing of the silicon implantation process includes implementing a first dosage of silicon atoms and the performing of the carbon implantation process includes implementing a second dosage of carbon atoms, the first dosage being the same as the second dosage.

7. The method of claim 1, wherein the performing of the silicon implantation process is implemented at a higher energy level than the performing of the carbon implantation process, and
wherein the first dosage source is tilted from a plane defined by an extending direction of the dummy gate structure and a vertical direction.

8. The method of claim 1, wherein the performing of the carbon implantation process includes forming a SiC-rich layer in the upper portion of the gate spacer, and wherein a bottom surface of the SiC-rich layer is below a top surface of the dummy gate structure.

9. A method, comprising:
forming a semiconductor structure including a dummy gate structure disposed over a semiconductor fin, the dummy gate structure extending lengthwise along a first direction;
depositing a spacer layer over the dummy gate structure;
recessing the spacer layer to form a gate spacer on a sidewall of the dummy gate structure, wherein the gate spacer includes an upper portion and a lower portion disposed below the upper portion;
forming source/drain (S/D) features in the semiconductor fin and adjacent to the gate spacer;
subsequently performing a silicon-based implantation to the upper portion of the gate spacer to form a silicon-treated upper portion;
performing a carbon-based implantation to the silicon-treated upper portion to form a carbon-treated upper portion, wherein the carbon-treated upper portion includes more carbon atoms than the lower portion;
depositing an interlayer dielectric (ILD) layer over the S/D features and on the gate spacer, wherein the ILD layer includes silicon oxide;
forming a high-k metal gate structure (HKMG) in place of the dummy gate structure; and
forming a dielectric layer in the ILD layer and over the S/D features,
wherein the performing of the silicon-based implantation and the performing of the carbon-based implantation each include implementing a dosage source tilted from a plane defined by the first direction and a second direction perpendicular to a top surface of the semiconductor fin.

10. The method of claim 9, wherein the dosage source is tilted from the second direction at an angle from about 5 degrees to about 15 degrees.

11. The method of claim 9, wherein the gate spacer is a first gate spacer and wherein the first gate spacer includes carbon atoms, the method further comprising forming a second gate spacer disposed between the sidewall of the dummy gate structure and the first gate spacer before performing the silicon-based implantation, wherein the second gate spacer includes more carbon atoms than the first gate spacer.

12. The method of claim 9, wherein the forming of the dielectric layer includes:

etching the ILD layer using an etchant having a higher etching rate with respect to the ILD layer than with respect to the carbon-treated upper portion; and
depositing the dielectric layer over the etched ILD layer.

13. The method of claim 9, wherein the performing of the silicon-based implantation includes bombarding the upper portion of the gate spacer with $SiF_4$.

14. The method of claim 9, wherein the performing of the carbon-based implantation includes bombarding the silicon-treated upper portion with $CO_2$.

15. The method of claim 9, further comprising forming an etch-stop layer over the S/D features and the gate spacer before performing the silicon-based implantation.

16. A method, comprising:
forming a fin protruding from a semiconductor substrate;
forming a dummy gate over the fin;
forming a spacer layer over the dummy gate;
etching the spacer layer to form a gate spacer along a sidewall of the dummy gate;
forming source/drain (S/D) features in the fin and adjacent to the gate spacer;
after forming the S/D features, treating the gate spacer, including:
implanting Si atoms in an upper portion of the gate spacer using a first dosage source, thereby increasing an amount of Si in the upper portion of the spacer layer with respect to a lower portion; and
implanting C atoms in the Si-implanted upper portion using a second dosage source different from the first dosing source, thereby increasing an amount of C in the Si-implanted upper portion with respect to the lower portion;
forming an interlayer dielectric (ILD) layer over the treated gate spacer;
replacing the dummy gate with a high-k metal gate (HKMG) in the ILD layer; and
forming a dielectric layer in a portion of the ILD layer over the S/D features.

17. The method of claim 16, wherein the forming of the dielectric layer includes:
etching the ILD layer to form an opening, wherein the etching of the ILD layer removes the ILD layer at a higher rate than the treated gate spacer; and
depositing the dielectric layer over the etched ILD layer to fill the opening, wherein the dielectric layer and the ILD layer have different compositions.

18. The method of claim 17, wherein the forming of the dielectric layer further includes removing portions of the dielectric layer deposited over a top surface of the HKMG, wherein the removing also removes a top portion of the treated gate spacer.

19. The method of claim 16, wherein the implanting of the Si atoms and the implanting of the C atoms include bombarding Si atoms and C atoms, respectively, at a tilt angle of about 5 degrees to about 15 degrees from a plane defined by an extending direction of the dummy gate and a vertical direction.

20. The method of claim 16, wherein the implanting of the Si atoms is implemented at a higher energy level than the implanting of the C atoms.

* * * * *